United States Patent
Pellet et al.

(10) Patent No.: US 10,488,879 B2
(45) Date of Patent: Nov. 26, 2019

(54) DEVICE AND METHOD FOR PERFORMING MAXIMUM POWER POINT TRACKING FOR PHOTOVOLTAIC DEVICES IN PRESENCE OF HYSTERESIS

(71) Applicant: ECOLE POLYTECHNIQUE FEDERALE DE LAUSANNE (EPFL), Lausanne (CH)

(72) Inventors: Norman Pellet, Morges (CH); Fabrizio Giordano, Saint-Sulpice (CH); Shaik Mohammed Zakeeruddin, Bussigny (CH); Michael Grätzel, Saint-Sulpice (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 36 days.

(21) Appl. No.: 15/915,114

(22) Filed: Mar. 8, 2018

(65) Prior Publication Data

US 2018/0259990 A1 Sep. 13, 2018

Related U.S. Application Data

(60) Provisional application No. 62/468,983, filed on Mar. 9, 2017.

(51) Int. Cl.
*G05F 1/67* (2006.01)
*H02S 20/32* (2014.01)
(Continued)

(52) U.S. Cl.
CPC ............ *G05F 1/67* (2013.01); *H01G 9/2022* (2013.01); *H01L 31/028* (2013.01);
(Continued)

(58) Field of Classification Search
CPC ............ G05F 1/67; H02S 20/32; H02S 40/30; H01G 9/2022; H01L 31/028; H01L 31/0687; H01L 31/0322
See application file for complete search history.

(56) References Cited

U.S. PATENT DOCUMENTS 9,018,800 B2    4/2015   Hester et al.
2005/0254191 A1   11/2005   Bashaw et al.
(Continued)

FOREIGN PATENT DOCUMENTS

CN    104378059 A    2/2015
CN    104682426 A    6/2015
(Continued)

OTHER PUBLICATIONS

Al-Amoudi, A., & Zhang, L. (Sep. 1998). Optimal control of a grid-connected PV system for maximum power point tracking and unity power factor. In IEE conference publication (pp. 80-85). Institution of Electrical Engineers.
(Continued)

*Primary Examiner* — Jayne L Mershon
(74) *Attorney, Agent, or Firm* — Andre Roland S.A.; Nikolaus Schibli

(57) ABSTRACT

A photovoltaic system including a solar cell having a hysteretic behavior; and a power device configured to extract a maximum power from the solar cell by forcing power oscillations of the power output by the solar cell.

3 Claims, 10 Drawing Sheets

(51) Int. Cl.
*H02S 40/30* (2014.01)
*H01L 31/0687* (2012.01)
*H01L 31/028* (2006.01)
*H01L 31/032* (2006.01)
*H01G 9/20* (2006.01)

(52) U.S. Cl.
CPC ...... *H01L 31/0322* (2013.01); *H01L 31/0687* (2013.01); *H02S 20/32* (2014.12); *H02S 40/30* (2014.12)

(56) References Cited

U.S. PATENT DOCUMENTS

| | | |
|---|---|---|
| 2007/0137688 A1 | 6/2007 | Yoshida |
| 2009/0115393 A1 | 5/2009 | Yoshida et al. |
| 2009/0283129 A1 | 11/2009 | Foss |
| 2009/0284078 A1 | 11/2009 | Zhang et al. |
| 2009/0284232 A1 | 11/2009 | Zhang et al. |
| 2010/0091532 A1 | 4/2010 | Fornage |
| 2012/0205973 A1 | 8/2012 | McCaslin |
| 2013/0106371 A1 | 5/2013 | Shimura |
| 2016/0164440 A1 | 6/2016 | Kataoka et al. |
| 2018/0226803 A1* | 8/2018 | Maki .................. G05F 1/67 |

FOREIGN PATENT DOCUMENTS

| | | | |
|---|---|---|---|
| EP | 1 239 576 | * | 3/2002 |
| EP | 1239576 A2 | | 9/2002 |
| EP | 2042965 A2 | | 4/2009 |
| JP | 2001178145 A | | 6/2001 |
| KR | 20160058304 A | | 5/2016 |
| WO | WO 2004100344 A2 | | 11/2004 |
| WO | WO 2012010613 A1 | | 1/2012 |
| WO | WO 2014039631 A1 | | 3/2014 |

OTHER PUBLICATIONS

Azab, M. (2008). A new maximum power point tracking for photovoltaic systems. waset. org, 34, 571-574.
Berrera, M., Dolara, A., Faranda, R., & Leva, S. (Jun. 2009). Experimental test of seven widely-adopted MPPT algorithms. In PowerTech, 2009 IEEE Bucharest (pp. 1-8). IEEE.
Brambilla, A., Gambarara, M., Garutti, A., & Ronchi, F. (1999). New approach to photovoltaic arrays maximum power point tracking. In Power Electronics Specialists Conference, 1999. PESC 99. 30th Annual IEEE (vol. 2, pp. 632-637). IEEE.
Chiang, M. L., Hua, C. C., & Lin, J. R. (2002). Direct power control for distributed PV power system. In Power Conversion Conference, 2002. PCC-Osaka 2002. Proceedings of the (vol. 1, pp. 311-315). IEEE.
Chomsuwan, K., Prisuwanna, P., & Monyakul, V. (May 2002). Photovoltaic grid-connected inverter using two-switch buck-boost converter. In Photovoltaic Specialists Conference, 2002. Conference Record of the Twenty-Ninth IEEE (pp. 1527-1530). IEEE.
D'Souza, N. S., Lopes, L. A., & Liu, X. (Jun. 2005). An intelligent maximum power point tracker using peak current control. In Power Electronics Specialists Conference, 2005. PESC'05. IEEE 36th (p. 172). IEEE.
Femia, N., Petrone, G., Spagnuolo, G., & Vitelli, M. (2005). Optimization of perturb and observe maximum power point tracking method. IEEE transactions on power electronics, 20(4), 963-973.
Hua, C. C., & Lin, J. R. (2001). Fully digital control of distributed photovoltaic power systems. In Industrial Electronics, 2001. Proceedings. ISIE 2001. IEEE International Symposium on (vol. 1, pp. 1-6). IEEE.
Hussein, K. H., Muta, I., Hoshino, T., & Osakada, M. (1995). Maximum photovoltaic power tracking: an algorithm for rapidly changing atmospheric conditions. IEE Proceedings—Generation, Transmission and Distribution, 142(1), 59-64.
Irisawa, K., Saito, T., Takano, I., & Sawada, Y. (2000). Maximum power point tracking control of photovoltaic generation system under non-uniform insolation by means of monitoring cells. In Photovoltaic Specialists Conference, 2000. Conference Record of the Twenty-Eighth IEEE (pp. 1707-1710). IEEE.
Jain, S., & Agarwal, V. (2004). A new algorithm for rapid tracking of approximate maximum power point in photovoltaic systems. IEEE power electronics letters, 2(1), 16-19.
Jung, Y., Yu, G., Choi, J., & Choi, J. (May 2002). High-frequency DC link inverter for grid-connected photovoltaic system. In Photovoltaic Specialists Conference, 2002. Conference Record of the Twenty-Ninth IEEE (pp. 1410-1413). IEEE.
Karak, S., Page, Z. A., Tinkham, J. S., Lahti, P. M., Emrick, T., & Duzhko, V. V. (2015). Raising efficiency of organic solar cells with electrotropic additives. Applied Physics Letters, 106(10), 30_1.
Kobayashi, K., & Takano, I. (2003). Sawada. Y. A study on a two stage maximum power point tracking control of a photovoltaic system under partially shaded insolation conditions. IEEE Power Eng. Soc. Gen. Meet, 2612-7.
Kuo, Y. C., Liang, T. J., & Chen, J. F. (2001). Novel maximum-power-point-tracking controller for photovoltaic energy conversion system. IEEE transactions on industrial electronics, 46(3), 594-601.
Rezvani, A., & Gandomkar, M. (2016). Modeling and control of grid connected intelligent hybrid photovoltaic system using new hybrid fuzzy-neural method. Solar Energy, 127, 1-18.
Tafticht, T., & Agbossou, K. (May 2004). Development of a MPPT method for photovoltaic systems. In Electrical and Computer Engineering, 2004. Canadian Conference on (vol. 2, pp. 1123-1126). IEEE.
Wasynezuk, O. (1983). Dynamic behavior of a class of photovoltaic power systems. IEEE transactions on power apparatus and systems, (9), 3031-3037.
Wu, W. J., Wickenheiser, A. M., Reissman, T., & Garcia, E. (2009). Modeling and experimental verification of synchronized discharging techniques for boosting power harvesting from piezoelectric transducers. Smart Materials and Structures, 18(5), 055012.
Yu, G. J., Jung, Y. S., Choi, J. Y., & Kim, G. S. (2004). A novel two-mode MPPT control algorithm based on comparative study of existing algorithms. Solar Energy, 76(4), 455-463.
Zhang, L., Al-Amoudi, A., & Bai, Y. (2000). Real-time maximum power point tracking for grid-connected photovoltaic systems. In Power Electronics and Variable Speed Drives, 2000. Eighth International Conference on (IEE Conf. Publ. No. 475) (pp. 124-129). IET.

* cited by examiner

DEVICE AND METHOD FOR PERFORMING MAXIMUM POWER POINT TRACKING FOR PHOTOVOLTAIC DEVICES IN PRESENCE OF HYSTERESIS

CROSS-REFERENCE TO RELATED APPLICATIONS

The present application claims priority to U.S. provisional patent application with the Ser. No. 62/468,983 that was filed on Mar. 9, 2017, the entire contents thereof herewith incorporated by reference.

FIELD OF THE INVENTION

The invention relates to a device, system and method to implement Perturb and Observe algorithms as employed in phototovoltaic systems in order to maximize the power output from a solar panel or an array of solar panels.

BACKGROUND ART

Maximum Power Point Tracking (MPPT) is necessary because variations of sun intensity or temperature throughout the day, which vary with the illumination angle, spectrum or due to shading and may significantly shift the optimal working voltage of the solar cell. Several examples of maximum power point tracking may be found in scientific literature for Silicon based solar cells.

Perturb and Observe (PERTURB AND OBSERVE) and Incremental Conductance (IncCon) are the most used MPPT methods. In PERTURB AND OBSERVE the power output is maximized by constantly perturbing voluntarily the operating voltage, unlike steady state methods such as fractional voltage or fractional current where a constant voltage or current is applied to the solar array and is based on the knowledge of the j-V characteristics of the PV array. In PERTURB AND OBSERVE, the power of the array is sampled and compared to the previous value. The duty cycle of the buck-boost converter ($t_{on}/t_{tot}$ of the gated switch) is adapted according to whether the power increases or decreases.

In IncCond, the differential conductance (dI/dV) and steady-state conductance (I/V) are calculated and the control on the duty cycle of the buck-boost converter is taken accordingly. Other examples make use of fuzzy logic, neural networks. Most investigations and tunings of MPPT algorithms focus on improving the steady-state performance, the transient response and the cost of implementation.

The presence of hysteresis between the backward voltage sweep and forward voltage sweep in perovskite cells has been extensively reported and its origin is still under debate. In such situations, the algorithm needs to deal with a non-symmetrical j-V relationship. If the hysteresis cannot be avoided, the MPPT algorithms must be adapted consequently.

In light of the above deficiencies of the background art, specifically with respect to the MPPT technology and methods, and the presence of a non-symmetricla j-V relationships, substantially improved and more sophisticated methods and devices are desired, to address these problems.

SUMMARY

In a first aspect the invention preferably provides a system or a device that includes at least a solar cell with an hysteretic behavior, and a device for an extraction of the maximum power from the solar cell forcing oscillating conditions.

In a preferred embodiment, the device for extraction preferably includes a Maximum Power Point Tracking (MPPT) circuit, the MPPT circuit having an output circuit configured to bias the solar cell at a maximum power point; an input circuit configured to sense a power output of the solar cell, and a controller including a memory storing a plurality of computer instructions thereon, the computer instructions configured to, when executed on a hardware processor of the controller, to perform a maximum power point tracking to generate a voltage bias for the solar cell, monitors the power output of the solar cell, and forces oscillations of the power output of the solar cell.

In a further preferred embodiment, the solar cell is a Tandem configuration of a Silicon or a Copper Indium Gallium Selenide (CIGS) solar cell with a perovskite based solar cell.

In a further preferred embodiment, the solar cell is one of the list comprising a perovskite based solar cell, a liquid state Dye sensitized solar cell, a solid state sensitized solar cell, an organic solar cell.

In a further preferred embodiment, the solar cell is a hole transporter free perovskite solar cell.

In a further preferred embodiment, the input stage is an electronic circuit comprising an Operational amplifier arranged in buffer configuration.

In a further preferred embodiment, the input stage is a DC-DC converter.

In a further preferred embodiment, the output stage is a resistor with a value of 0.5 Ohm.

In a further preferred embodiment, the controller is an Arduino-based controller.

According to a second aspect of the present invention, a method for tracking a maximum power output of a solar cell in presence of hysteresis is provided. The method preferably includes the steps of sampling a voltage and a current of the solar cell (V(k), I(k)), determining a voltage variation and a current variation by substracting respectively from the sampled voltage a value of a previously sampled voltage (V(k)−V(k−1)) and from the sample current a previously sampled current (I(k)−I(k−1)), comparing respectively the voltage variation and the current variation to a determined typical system noise value and rejecting the sampled voltage value and the sampled current as non-significant if the comparing shows that the voltage variation and the current variation are inferior to the determined typical system noise value, computing the power for the sampled voltage and current, comparing the computed power to the previously computed power for previously sampled voltage and current.

Moreover, the method further preferably includes the steps of incrementing the voltage by $\text{sign}(dV) \cdot \Delta V_{DAC}$ if the computed power is greater than the previously computed power, incrementing the voltage by $\text{sign}(dV) \cdot \Delta V_{DAC}$ if the computed power is not greater than the previously computed power and the dV is positive and the relative decrement of power is smaller of the forward power threshold efw, incrementing the voltage by $\text{sign}(dV) \cdot \Delta V_{DAC}$ if the computed power is not greater than the previously computed power and the dV is negative and the relative decrement of power is smaller of the backward power threshold ebw, incrementing the voltage by $-\text{sign}(dV) \cdot \Delta V_{DAC}$ if the computed power is not greater than the previously computed power and the dV is positive and the relative decrement of power is bigger of the forward power threshold efw, and incrementing the voltage by $-\mathrm{sign}(dV) \cdot \Delta V_{DAC}$ if the computed power is not greater than the previously computed power and the dV is negative and the relative decrement of power is bigger of the backward power threshold ebw.

In a preferred embodiment of the method, the determined typical noise value of the system is preferably 1% of the current or voltage at maximum power point.

In a further preferred embodiment of the method, the selected forward power threshold efw and the backward power threshold ebw are preferably in the range between 0.2% and 20% for both parameters.

The above and other objects, features and advantages of the present invention and the manner of realizing them will become more apparent, and the invention itself will best be understood from a study of the following description with reference to the attached drawings showing some preferred embodiments of the invention.

BRIEF DESCRIPTION OF THE SEVERAL VIEWS OF THE DRAWINGS

The accompanying drawings, which are incorporated herein and constitute part of this specification, illustrate the presently preferred embodiments of the invention, and together with the general description given above and the detailed description given below, serve to explain features of the invention.

Herein, identical reference numerals are used, where possible, to designate identical elements that are common to the figures. Also, the images are simplified for illustration purposes and may not be depicted to scale.

DETAILED DESCRIPTION OF THE SEVERAL EMBODIMENTS

According to one aspect of the present invention, with the system, device, or method, it is possible to improve the traditional device for interfacing and harvesting power from photovoltaic systems without failing in tracking the maximum power output of Solar cells in presence of hysteresis. To alleviate the hysteretic response and non-optimal power tracking, an optimized power inversion threshold is added to the classical Perturb and Observe algorithm, which makes the solar cell enter into a regime of forced oscillations.

According to an aspect, the advantages of the system, method and device include an easy implementation, control of the level of oscillations of the power output, and effective maximization of the power output of solar cells, not limited to Perovskite Solar cells, in presence of hysteresis.

Figure 1:
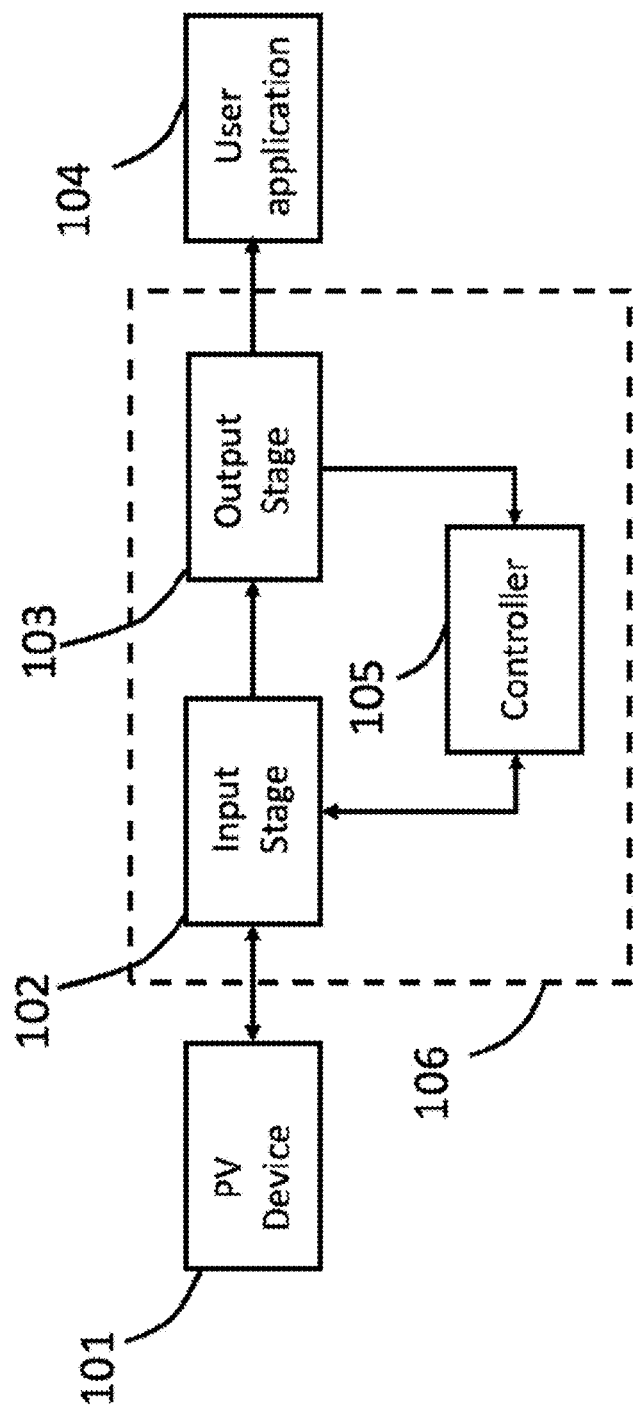
FIG. 1 shows a schematical view of a block diagram of one embodiment of a system or device for extracting maximum power from a solar cell.
Figure 8A:
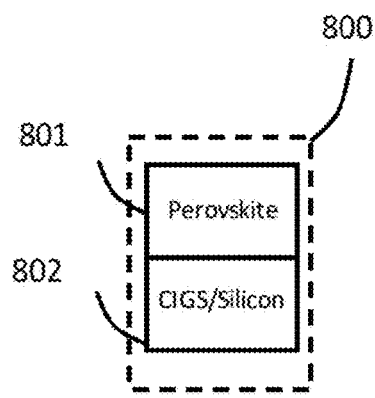
FIGS. 8A to 8E shows an exemplary schematic representations of several photovoltaic technologies that can be used with the device, system, or method according to one aspect of the present invention.

FIG. 1 shows the simplified block diagram of the device 106 comprising an input circuit or stage 102, in the variant shown an operational amplifier in follower configuration, for example OPA192, placed within the feedback loop of the precision driver, for example INA132. A digital-to-analog converter, for example DAC7513, interfaced by a controller 105, sources the reference voltage that biases the PV device 101, or solar cell. The output circuit or stage 103 includes a small resistance, for example approximately 0.5 Ohm, to sense the sinking or sourcing current, positioned in series with the device, a high gain (200 V/V) instrument amplifier, for example an INA188, and a $4^{th}$ order Butterworth low-pass filter, for example an OPA4722 that serves both anti-aliasing and high frequency noise removal. The output of the filter is fed into a sixteen (16) bit analog-to-digital converter, for example an ADS1118 for the sampling, also interfaced by controller 105. Moreover, with reference to FIG. 8E, the photovoltaic block can include a single solar cell 841 or a module of solar cells connected in series or in parallel 840, or a combination thereof. Several photovoltaic technologies can be implemented in this block such as Perovskite solar cells 810 and organic or dye sensitized solar cell 830, as shown in FIGS. 8B and 8D, respectively.

Figure 8B:
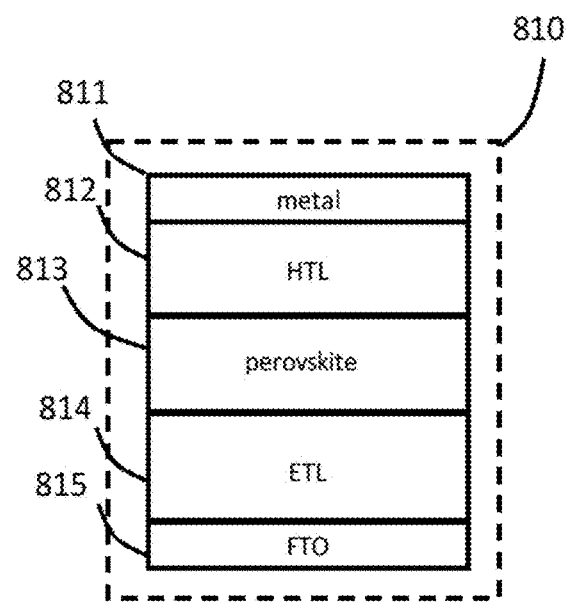
Figure 8C:
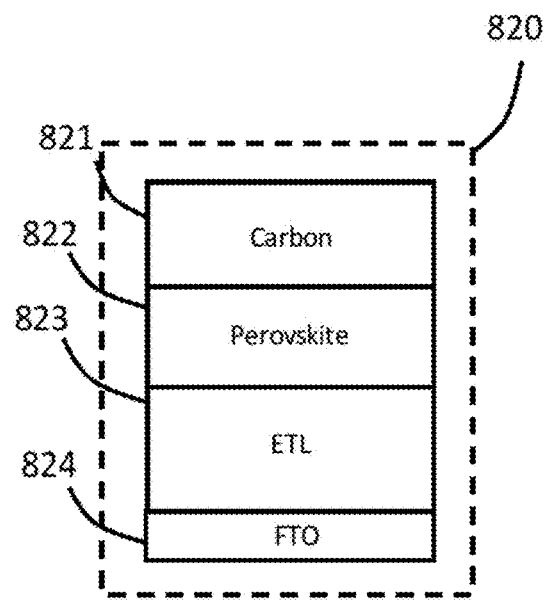
Figure 8D:
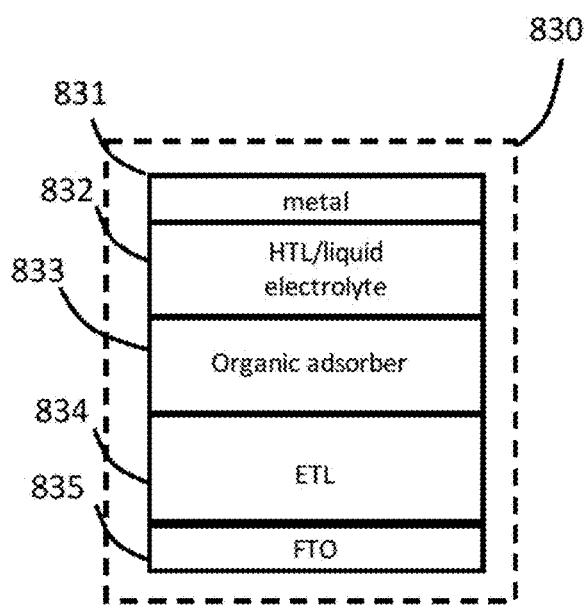
Figure 8E:
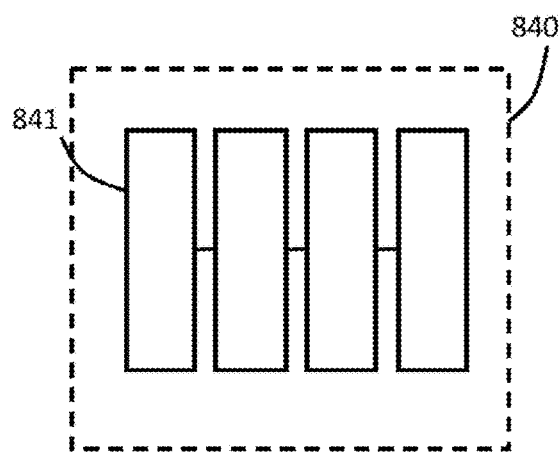

These devices comprise an adsorber 813 and 833 an electron transporting layer 814 and 834 and a hole transporting layer 812 and 832 encapsulated between a glass with a conductive Fluorinated Tin Oxide (FTO) layer 815 and 835 and a metal Counterelectrode 811 and 831, as shown in FIGS. 8B and 8D, respectively. Also tandem perovskite/silicon or perovskite/CIGS 800 can be implemented by PV device 101, as exemplarily shown in FIG. 8A, where the hysteretic behavior of the perovskite device 801 is found also in the tandem configuration with a silicon or CIGS device 802. According to another preferred embodiment, carbon based perovskite solar cell 820 can be used for PV device 101, as schematically shown in FIG. 8C. This particularly interesting configuration of perovskite solar cells which works without hole transporting material comprise an adsorber 823, an electron transporting layer (ETL) 823 and a porous carbon counterelectrode 821 all stacked on a glass with a conductive Fluorinated Tin Oxide (FTO) layer 824.

In a preferred embodiment, the controller includes a hardware processor that is a programmable, for example an Arduino Nano, mounted onto the board. The hardware processor is operatively connected to a memory, and the memory can store computer-readable instructions thereon, the computer-readable instructions executable by the hardware processor the perform a method of for tracking a maximum power output of a solar cell in presence of hysteresis.

Perturb and Observe relies on hill-climbing, in other words, the power output is maximized by constantly perturbing voluntarily the operating voltage, unlike steady state methods such as fractional voltage or fractional current where a constant voltage or current is applied to the solar array and is based on the knowledge of the j-V characteristics of the PV array and are therefore not suitable for ageing tests. In Perturb and Observe, the power of the array is sampled and compared to the previous value. According to some aspects of the present invention, an additional condition has to be satisfied as a tracking goal. The new power needs to be higher than a defined threshold before inverting the voltage scan direction, see for example FIG. 3.

Figure 2:
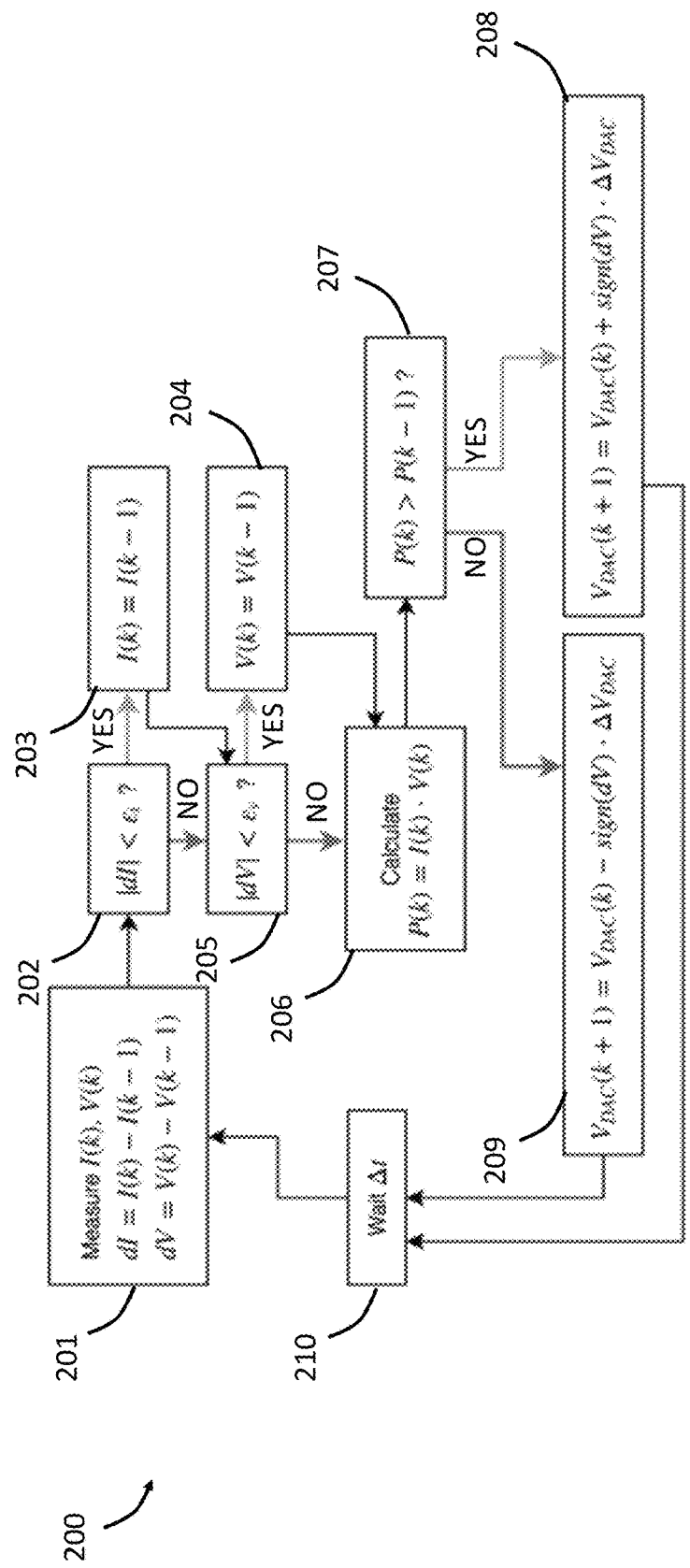
FIG. 2 shows an exemplary flowcharts for a standard perturb and observe algorithm according to the background art.

FIG. 2 schematically shows a standard perturb and observe (P&O) algorithm flowchart according to the background art, the generic cycle k, including noise thresholds ($\varepsilon_i$ and $\varepsilon_v$) to correct the transient behavior of the sampler, non-linearity and noise. In this configuration, the correction of the load is not done through adapting the duty cycle of the buck converter, but through changing the applied voltage driving the solar cell.

Figure 3:
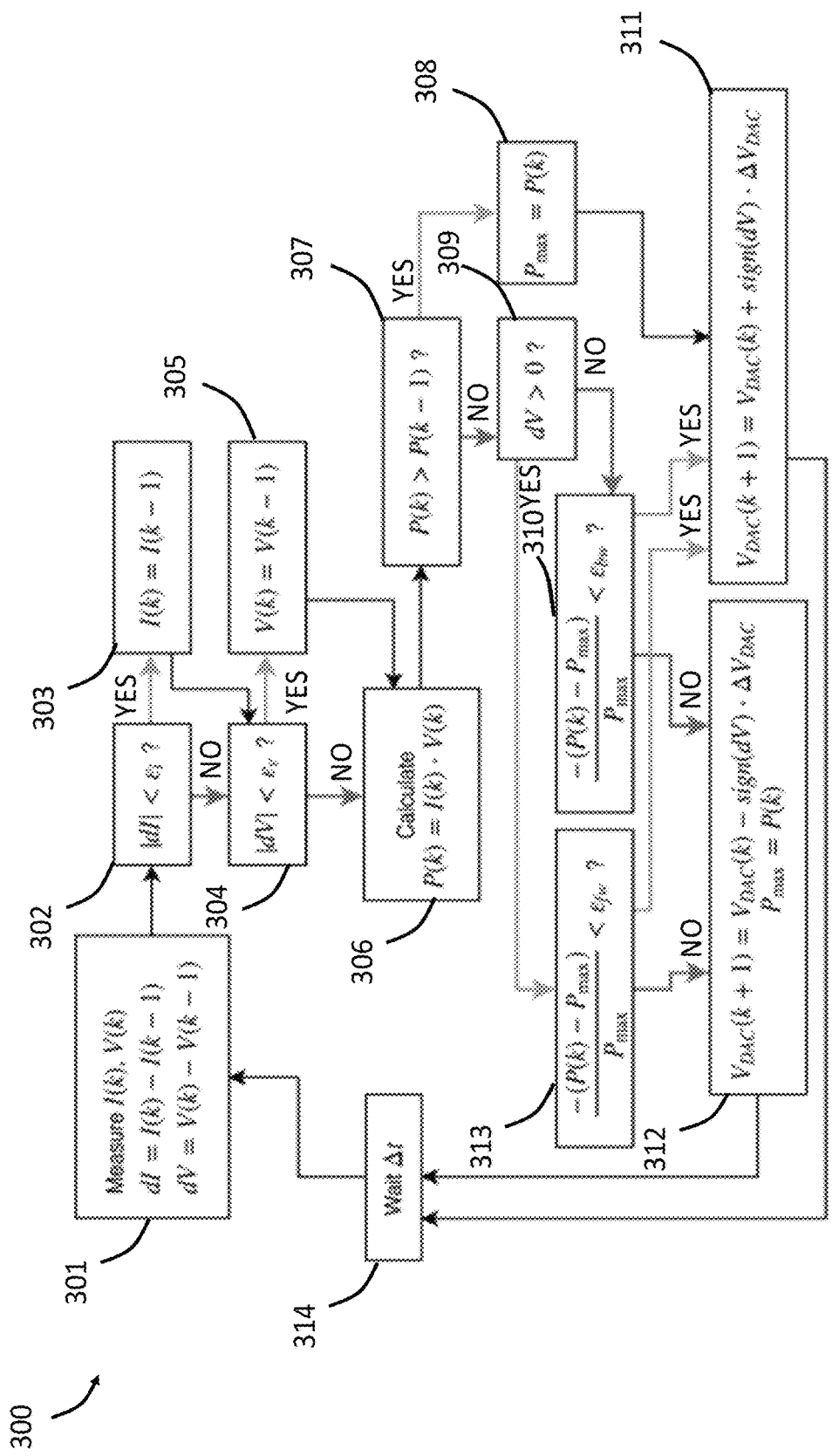
FIG. 3 shows an exemplary flowchart for a modified perturb and observe algorithm B according to an exemplary embodiment according to an aspect of the present invention.

FIG. 3 shows a modified perturb and observe (P&O) algorithm flowchart according to an example embodiment, including the power thresholds $\varepsilon_{fw}$ and $\varepsilon_{bw}$. The local maximum power is adapted each time the power increases or when a switch in scanning direction is done. The additional conditions of flow chart elements 309, 313 and 310 represent another embodiment, as further explained below.

Perturb and Observe algorithms are employed in photovoltaic systems in order to maximize the power output from a solar panel or an array of solar panels. According to one aspect of the present invention, the system, device and method addresses modifications of the background art of these algorithms in presence of hysteretic behaviour of the solar cells.

The standard algorithm as shown in FIG. 2 works sampling the current and voltage of the solar cell I(k) and V(k) by block or flowchart element 201. Any non-significant voltage or current variation (defined as I(k)−I(k−1) and V(k)−V(k−1)), for example if variations are below the typical system noise, will be rejected. If any of the two variations is under their respectively defined noise thresholds, $\varepsilon_v$ and $\varepsilon_I$, the algorithm continues the small perturbation voltage sweep uninterrupted without changing the bias point. The power is computed and compared to the previous power, in blocks or flowchart elements 206 and 207. If the power has increased with regards to the latest record, the voltage is incremented by the value sign(dV)·$\Delta V_{DAC}$, in other words, the device is biased further into the direction it is currently going, in flowchart element or block 208. If the power output decreases compared to the previous one, the bias is incremented by −sign(dV)·$\Delta V_{DAC}$, in other words the direction of tracking is reversed by block or flowchart element 209.

However, this implementation of FIG. 2 yields poor results of power tracking for perovskite solar cells. In fact, when the algorithm switches from backward scanning to forward scanning at a voltage below $V_{MPP}$ the output power decreases, instead of an expected increase for a fast-responding, hysteresis-free solar cell. In a hysteretic solar cell, multiple maximum power points coexist depending on the scan rate, scan direction, voltage bias. Switching the scanning direction is one of the reasons why the solar cell has more than one maximum power point. This leads to an apparent drop of power and confuses the standard algorithm. The algorithm switches back the scanning to backward direction, which translates into a temporary increase of power, during a few mV, followed by a decrease, upon which the algorithm switches again to forward scanning, and the cycle happens again, yet at a lower voltage. This misleading phenomenon saturates at very low voltages, far away from maximum power point. After saturation, the voltage climbs up uninterruptedly until reaching a maximum power point at high bias. As a consequence, the tracking is done at a potential lower than optimal and the device undergoes significant oscillations. The magnitude of this effect is expected to depend strongly on the voltage step size (2 mV in our case) and the time delay between the DAC setting and the AD sampling.

Figure 4:
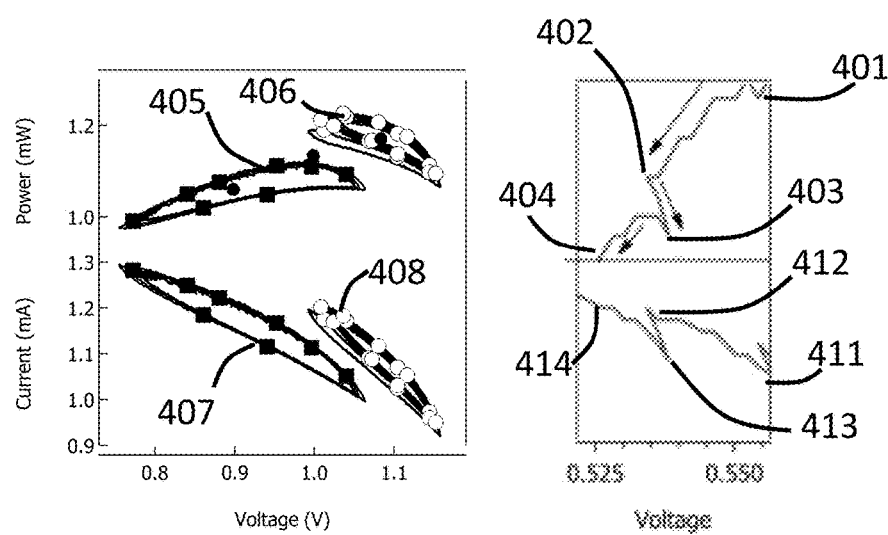
FIG. 4 shows an exemplary graph of a performed perturb and observe algorithm.

In light of these problems and drawbacks, according to an aspect of the present invention, the exemplary algorithm shown in FIG. 2 of the background art is modified as shown in FIG. 3 by introducing a threshold $\varepsilon_{fw}$ and $\varepsilon_{bw}$, typically in the range between 0.2% and 20% of the total power of the solar cells, respectively in the blocks or flow chart elements 313 and 310, below which the power has to drop, compared to the previous local maxima, before switching direction, see FIG. 4, for example trace 402.

Adding this hysteretic controller algorithm forces the tracker to scan further into forward bias before switching to backward scan. This has the effect of reducing the bias drift, but also furnishes a parameter to control the magnitude of the oscillations. As a net result, an improved power conversion efficiency is measured. When the threshold is set low, which would signify that the algorithm is similar to the background art algorithm, the device will be tracked at lower bias than optimal, however if the threshold is high, the power output will oscillate. Such thresholds are usually not required for currently marketed photovoltaic arrays. The average power output of the solar cell is largely unaffected by the backward to forward threshold because of the direction of the hysteresis: when the device is switched from forward to backward scanning, the power immediately increases, hence the backward to forward threshold parameter is not required for stabilization.

Referring again to FIG. 4, the exemplary graphs shown therein represent the Perturb and Observe algorithm performed without threshold regulation, see traces 405 and 407. The device undergoes significant oscillation. Below the maximum power point, see at points 401 and 411, the power decreases as the voltage decreases. When above the noise threshold, see points 402 and 412, the algorithm switches direction and increases the voltage, see points 403 and 413. However, due to the hysteresis, the power has further decreased and hence the perturbation is switched again to backward scanning, see points 404 and 414. As a result, large oscillations are created below the actual maximum power point. The traces 406 and 408 of FIG. 4 correspond respectively to the power and current of the solar cell when tracked with the device, system, or method, according to an aspect, including the modified algorithm with power threshold regulation, showing reduced oscillations.

The detailed algorithm operates the following instructions. First, the algorithm samples a voltage and a current of the solar cell (V(k), I(k)), determines a voltage variation and a current variation by substracting respectively from the sampled voltage a value of a previously sampled voltage (V(k)−V(k−1)) and from the sample current a previously sampled current (I(k)−I(k−1)). In the ensuing step, the algorithm compares respectively the voltage variation and the current variation to a determined typical system noise value. For example, in a preferred embodiment, 1% of the current or voltage at maximum power point is considered a typical system noise value, and the algorithm rejects the sampled voltage value and the sampled current as non-significant if the comparing shows that the voltage variation and the current variation are inferior to the determined system noise value. The algorithm computes the power for the sampled voltage and current and compares it to the previously computed power for previously sampled voltage and current.

Depending on the values coming from these comparisons, the algorithm operates on the bias of the solar cell as stated in the following conditions:

(i) increments the voltage by sign(dV)·$\Delta V_{DAC}$ if the computed power is greater than the previously computed power;

(ii) increments the voltage by sign(dV)·$\Delta V_{DAC}$ if the computed power is not greater than the previously computed power and the dV is positive and the relative decrement of power is smaller of the forward power threshold efw;

(iii) increments the voltage by sign(dV)·$\Delta V_{DAC}$ if the computed power is not greater than the previously computed power and the dV is negative and the relative decrement of power is smaller of the backward power threshold ebw;

(iv) increments the voltage by −sign(dV)·$\Delta V_{DAC}$ if the computed power is not greater than the previously computed power and the dV is positive and the relative decrement of power is bigger of the forward power threshold efw; and (iiv) increments the voltage by −sign(dV)·$\Delta V_{DAC}$ if the computed power is not greater than the previously computed power and the dV is negative and the relative decrement of power is bigger of the backward power threshold ebw.

The power output is strongly correlated to $\varepsilon_{fw}$, the forward to backward threshold, for reasons mentioned above. By preventing the device from switching too easily from forward to backward scan, oscillations can be avoided. An example of the dependence of the power on the threshold value is given in FIG. 7.

Figure 7:
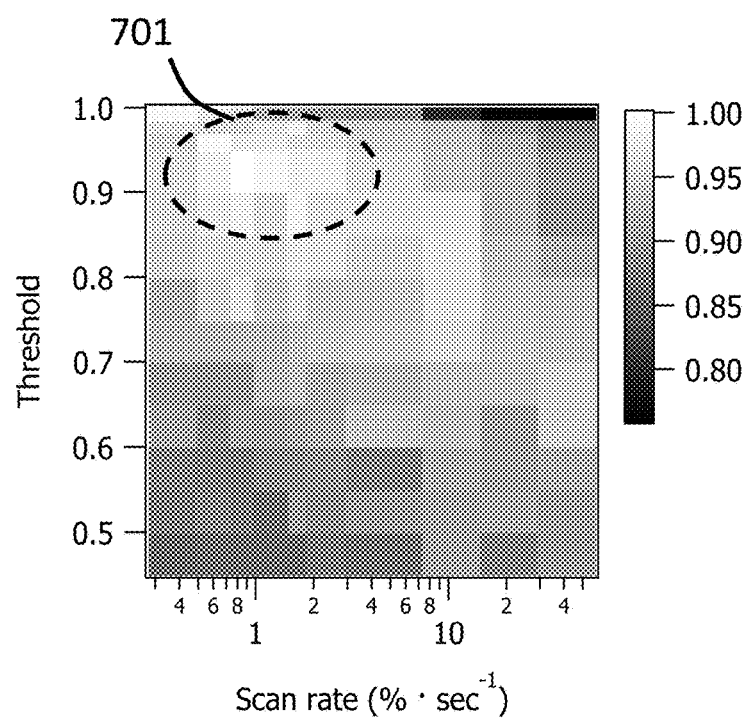
FIG. 7 shows an example of parametric matrix showing power output as a function of the forward to backward threshold (y axis) and the scan rate (x axis)

FIG. 7 shows an exemplary parametric matrix showing power output as a function of the forward to backward threshold, represented along the y axis, and the scan rate, represented along the x axis. The region 701 with the lightest grayscale tones indicates the area that maximizes the power output by considering the scan rate and the threshold values.

Strikingly, for some perovskite cells, it has been found that the optimal set of oscillation thresholds is not the one that minimizes the oscillation, which is unexpected to one of ordinary skill in the art because any voltage away from the maximum power point would be expected to be less than optimal, given classical MPPT schemes. An example of effective tracking with different forward to backward thresholds is shown for a device in FIG. 3. The average power output of the cell with strong oscillation in forward bias was found to be higher, in this particular example, by about 3%, than the cell with the lowest possible oscillation and over 30% compared to the non-regulated algorithm.

According to some aspects of the present invention, with the present device, system, and method, this poling effect to help the charge extraction when the device is strongly biased. Indeed this feature can be used to enhance the power output of the cell by temporarily poling the device at higher potential, and the overall gain in average power outweighs the losses due to oscillations. This is a property of hysteretic perovskite-based solar cells

EXAMPLES OF APPLICATIONS

Referring again to FIG. 5, this represents a MPPT of a $CH_3NH_3PbBr_3$ solar cell, see traces 502 503 and 504, and a crystalline silicon cell, see trace 501, in different conditions. 503: No threshold regulation. 502: lower attained oscillation. 504: highest attained efficiency.

Figure 5:
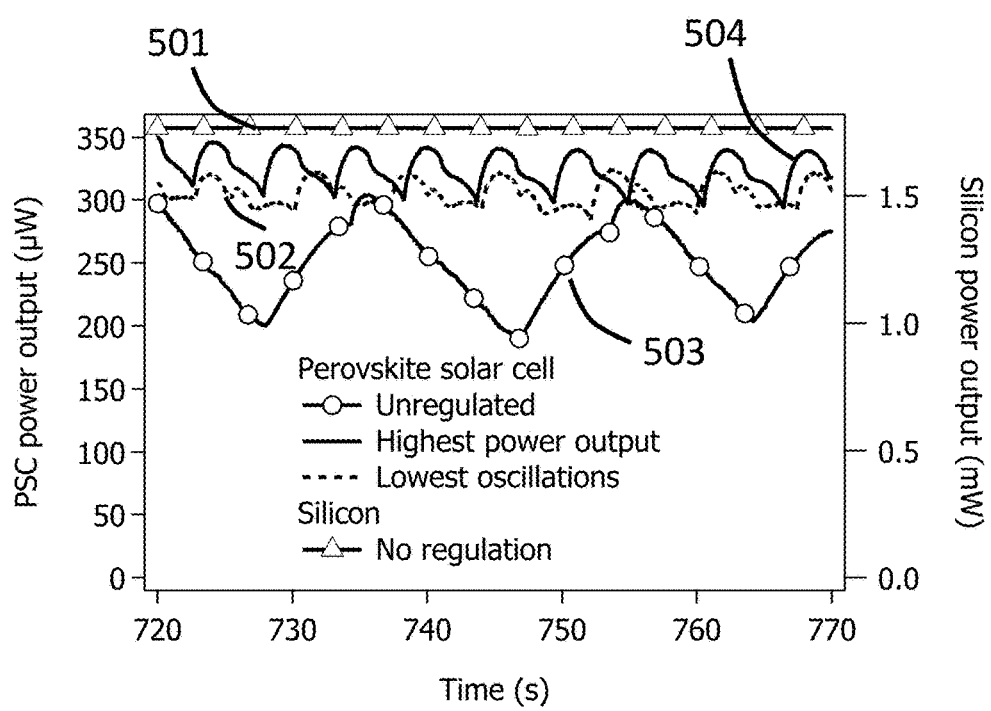
FIG. 5 shows an exemplary graph of maximum power point tracking of a $CH_3NH_3PbBr_3$ solar cell and a crystalline silicon cell in different conditions.

FIG. 5 shows the example of MPPT under illumination of a conventional bromide perovskite-based solar cell compared to a silicon solar cell without regulation, see trace 501. In this example, the effect of the introduction of thresholds in the conventional algorithm is shown. Trace 503 is the power extracted from the perovskite device with the conventional algorithm. Trace 502 the power extracted from the perovskite device with the modified algorithm according to one aspect of the present system, device, and method. Trace 504 the power extracted from the perovskite device according to another aspect of the present system, device, and method with the modified algorithm with a regime of forced oscillations.

Experimental details of the device fabrication for Bromide based devices:

FAPbBr3 device fabrication: all materials were purchased from Sigma-Aldrich or Acros Organics and were used as received. FAPbBr3 films were deposited using sequential deposition method. 1.2 M PbBr2 precursor solution in DMF+DMSO mixture (1:1 volume ratio) was prepared by constant stirring at 60° C. for 30 min. 50 uL of 1.2 M PbBr2 precursor solution was spin coated onto the mesoporous TiO2 films at 3000 rpm for 30 s. This was followed by annealing the films at 80° C. for 15 min. After cooling to room temperature, the PbBr2 films were dipped into isopropanol solution of FABr (50×10−3 m) for 5 min at 60° C., rinsed with 2-propanol for 5 s and dried at 80° C. for 30 min. Spiro-OMeTAD as HTM was deposited by spin coating 40 μL of the prepared solution at 4000 rpm for 30 s. The HTM solution was prepared by dissolving 72.3 mg (2,2′,7,7′-tetrakis(N,N-di-p-methoxyphenylamine)-9,9-spirobifluorene) (spiro-OMeTAD), 17.5 μL of a stock solution of 520 mg mL-1 bis(trifluoromethylsulphonyl)imide in acetonitrile, and 29 μL of a stock solution of 300 mg mL-1tris(2-(1H-pyrazol-1-yl)-4-tert-butylpyridine)cobalt(III) bis(trifluoromethylsulphonyl)imide in acetonitrile, and 28.8 μL 4-tert-butylpyridine in 1 mL chlorobenzene. The device fabrication was carried out under controlled atmospheric conditions with humidity <2%. Finally, device fabrication was completed by thermally evaporating 70 nm of gold layer as a back contact.

Figure 6:
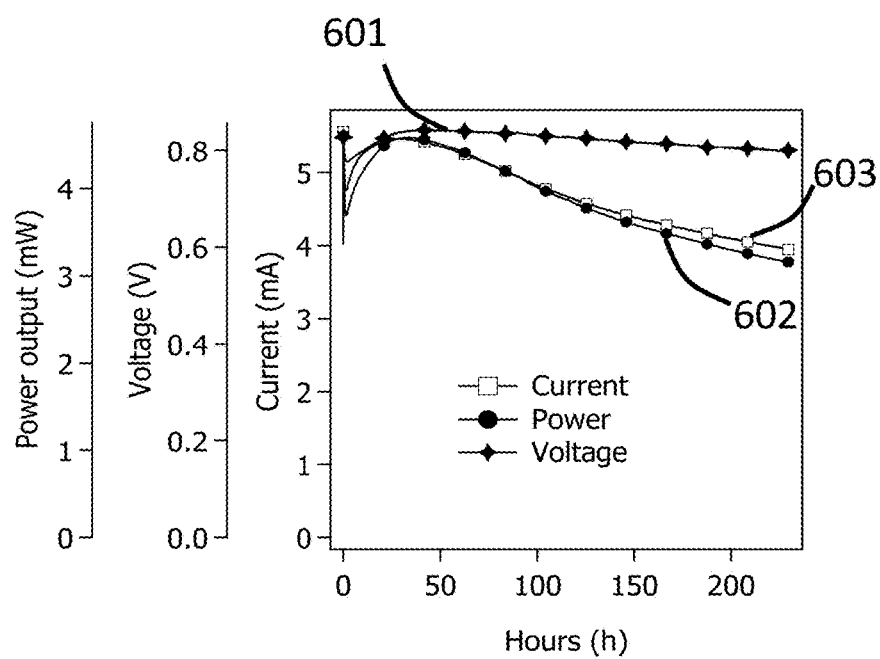
FIG. 6 shows an exemplary graph of an example maximum power point evolution of a perovskite cell.

In FIG. 6, graphs are shown as an example of application of the Maximum power point setup of one aspect of the present invention in tracking a device of 0.25 cm$^2$ (FAPbI$_3$)$_{0.85}$(MAPbBr$_3$)$_{0.15}$ perovskite cell sealed inside a box flushed with dry N$_2$, under an equivalent illumination of 1000 W m$^2$, at 60° C. for 230 hours, for (FAPbI$_3$)$_{0.85}$(MAPbBr$_3$)$_{0.15}$ Based devices.

Fluorine-doped tin oxide (FTO) glass was etched to form the two detached electrodes with zinc powder and diluted hydrochloric acid. The glass was then cleaned by sonication in 2% Hellmanex solution. Thereafter, the glass substrates were rinsed with deionized water and Ethanol and dried with compressed air and subject to UV-Ozone treatment for 15 min.

A compact hole blocking layer of TiO2 was deposited onto the glass by spray pyrolysis. The precursor solution consisted of 600 μl of titanium diisopropoxide bis(acetylacetonate), 400 μl of acetylacetone in 9 mL of ethanol, which was then sprayed with the carrier gas oxygen at 450° C. A scaffold of mesoporous TiO2 (m-TiO2) was deposited by spin coating a 1:5 (w/w) dispersion of TiO2 with particle size of 30 nm in Ethanol at 4000 rpm for 10 sec to maintain a thickness of about 300 nm. The thus formed films were then heated up to 450° C. and sintered at that temperature for 30 min and allowed to cool to 100° C. A surface treatment of the m-TiO2 was carried out by spincoating a solution of 10 mg/mL of Bis(trifluoromethane)sulfonimide lithium salt in Acetonitrile at 3000 rpm for 10 sec. The substrates were then baked again by the procedure described above. The substrates were then baked again by the procedure described above. The cooled substrates were then used for the deposition of perovskite upon them.

Upon cooling to room temperature, the perovskite layer was deposited in a dry air-filled glovebox by spin coating the perovskite precursor solution. The latter consisted in a solution containing FAI (1 M), $PbI_2$ (1.1 M), MABr (0.2 M) and $PbBr_2$ (0.2 M) in anhydrous dimethylformamide/dimethylsulphoxide (4:1 (v:v)) solution. The perovskite solution was spin coated in a two-step program at 1,000 and 6,000 r.p.m. for 10 and 30 s, respectively. During the second step, 120 µl of clorobenzene was poured on the spinning substrate 10 s prior the end of the program. The substrates were then annealed at 100° C. for 1 h in nitrogen-filled glove box.

The HTM was subsequently deposited on the top of the perovskite layer by spin coating its solution at 4000 rpm for 20 s with a ramp of 2000 rpm s-1. To the prepared solution of 50 mg of spiro-OMeTAD in 574 µl of CB, 20 uL of tert-butylpyridine, 11.4 µl of 1.8M LiTFSI in acetonitrile and 4.9 µl of 0.25M Cobaltsalt (FK 209) in Acetonitrile were added as dopants.

Finally, device fabrication was completed by thermally evaporating 70 nm of gold layer as a back contact.

Induced perturbation is easily implementable in any microcontroller-based MPPT that regulates the duty cycle of a DC/DC converter. Returning to FIG. 7, this shows a matrix of optimization of the threshold values as a function of the scan rate of the oscillations. This optimization is done on a perovskite photovoltaic module tracked by a microcontroller-based MPPT that regulates the duty cycle of a DC/DC converter. This variant provides for an exemplary embodiment for using the method in the context of an existing photovoltaic system.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A method for tracking a maximum power output of a solar cell in presence of hysteresis, comprising the steps of:
sampling a voltage and a current of the solar cell (V(k), I(k));
determining a voltage variation and a current variation by substracting respectively from the sampled voltage a value of a previously sampled voltage (V(k)−V(k−1)) and from the sample current a previously sampled current (I(k)−I(k−1));
comparing respectively the voltage variation and the current variation to a determined typical system noise value and rejecting the sampled voltage value and the sampled current as non-significant if the comparing shows that the voltage variation and the current variation are inferior to the determined typical system noise value;
computing the power for the sampled voltage and current;
comparing the computed power to the previously computed power for previously sampled voltage and current;
incrementing the voltage by sign(dV)·$\Delta V_{DAC}$ if the computed power is greater than the previously computed power;
incrementing the voltage by sign(dV)·$\Delta V_{DAC}$ if the computed power is not greater than the previously computed power and the dV is positive and the relative decrement of power is smaller of the forward power threshold efw;
incrementing the voltage by sign(dV)·$\Delta V_{DAC}$ if the computed power is not greater than the previously computed power and the dV is negative and the relative decrement of power is smaller of the backward power threshold ebw;
incrementing the voltage by −sign(dV)·$\Delta V_{DAC}$ if the computed power is not greater than the previously computed power and the dV is positive and the relative decrement of power is bigger of the forward power threshold efw; and
incrementing the voltage by −sign(dV)·$\Delta V_{DAC}$ if the computed power is not greater than the previously computed power and the dV is negative and the relative decrement of power is bigger of the backward power threshold ebw.

2. The method according to claim 1, wherein the determined typical noise value of the system is about 1% of the current or voltage at maximum power point.

3. The method according to claim 1, wherein the selected forward power threshold efw and the backward power threshold ebw are in the range between 0.2% and 20% for both parameters.

* * * * *